US010109787B2

(12) United States Patent
Green et al.

(10) Patent No.: US 10,109,787 B2
(45) Date of Patent: Oct. 23, 2018

(54) WELL-BASED VERTICAL HALL ELEMENT WITH ENHANCED MAGNETIC SENSITIVITY

(71) Applicant: Texas Instruments Incorporated, Dallas, TX (US)

(72) Inventors: Keith Ryan Green, Prosper, TX (US); Iouri Mirgorodski, Sunnyvale, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/335,726

(22) Filed: Oct. 27, 2016

(65) Prior Publication Data

US 2018/0123023 A1    May 3, 2018

(51) Int. Cl.
*H01L 43/06* (2006.01)
*H01L 43/14* (2006.01)
*H01L 21/66* (2006.01)

(52) U.S. Cl.
CPC .............. *H01L 43/06* (2013.01); *H01L 22/30* (2013.01); *H01L 43/14* (2013.01)

(58) Field of Classification Search
CPC ....... H01L 43/04; H01L 43/065; H01L 43/14; G01R 33/0053; G01R 33/07
See application file for complete search history.

(56) References Cited

U.S. PATENT DOCUMENTS

| 2004/0207031 A1* | 10/2004 | Berndt | H01L 27/1203 257/414 |
| 2010/0047954 A1* | 2/2010 | Su | B26F 3/002 438/61 |
| 2010/0164483 A1* | 7/2010 | Namai | G01R 33/07 324/207.2 |
| 2010/0252900 A1* | 10/2010 | Minixhofer | G01R 33/07 257/421 |
| 2016/0268498 A1* | 9/2016 | Eckinger | H01L 43/04 |

\* cited by examiner

*Primary Examiner* — Whitney T Moore
*Assistant Examiner* — Joseph Galvin, III
(74) *Attorney, Agent, or Firm* — Ronald O. Neerings; Charles A. Brill; Frank D. Cimino

(57) ABSTRACT

A vertical Hall element and method of fabricating are disclosed. The method includes forming a buried region having a first conductivity type in a substrate having a second conductivity type and implanting a dopant of the first conductivity type into a well region between the top surface of the substrate and the buried region. The buried region has a doping concentration increasing with an increasing depth from a top surface of the substrate and the well region has a doping concentration decreasing from the top surface of the substrate to the buried region. The method includes forming first through fifth contacts on the well region. First and second contacts define a conductive path and second and third contacts define another conductive path through the well region. The fourth contact is formed between first and second contacts and the fifth contact is formed between second and third contacts.

26 Claims, 19 Drawing Sheets

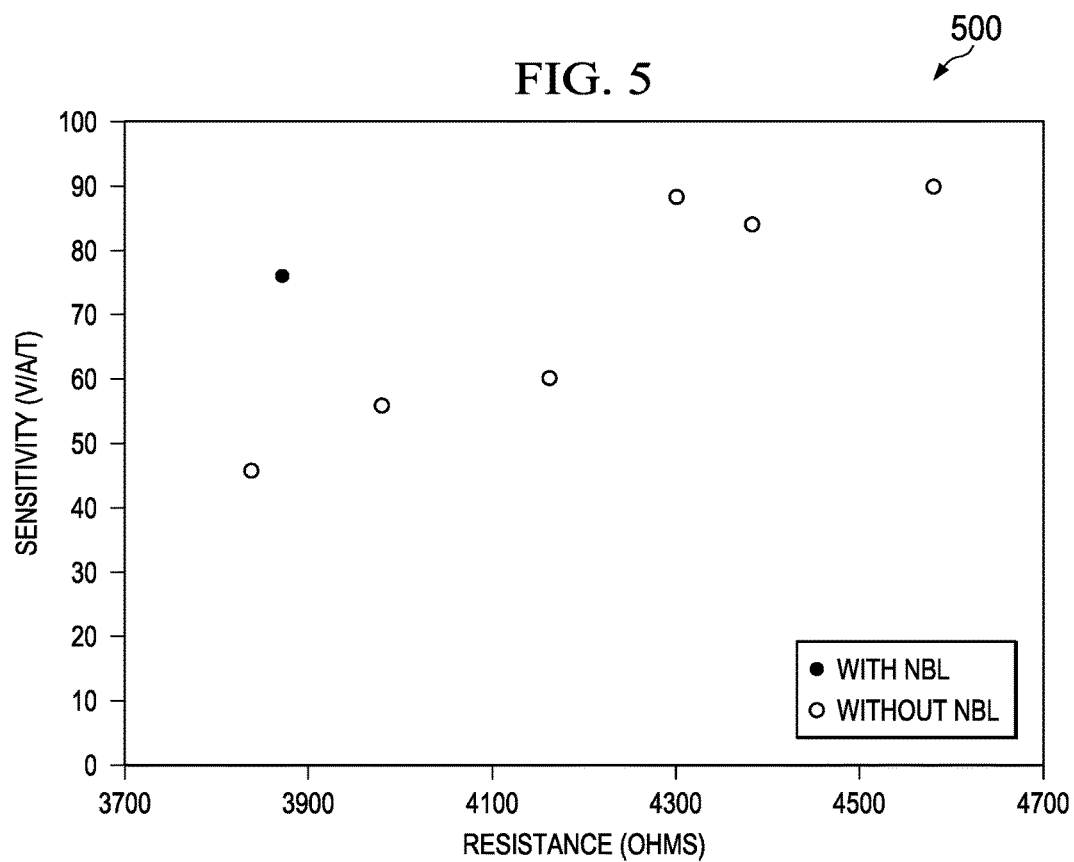
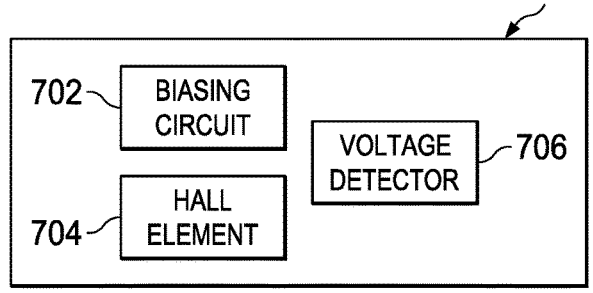

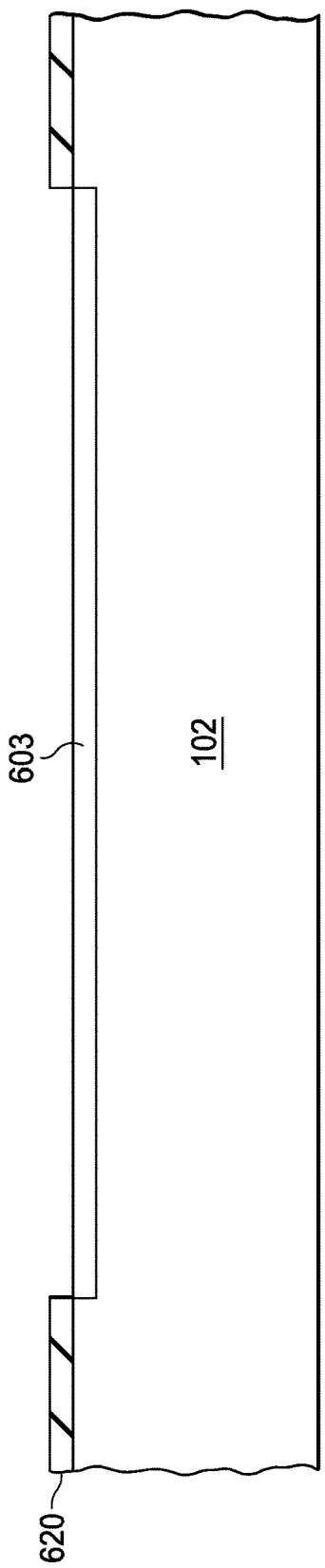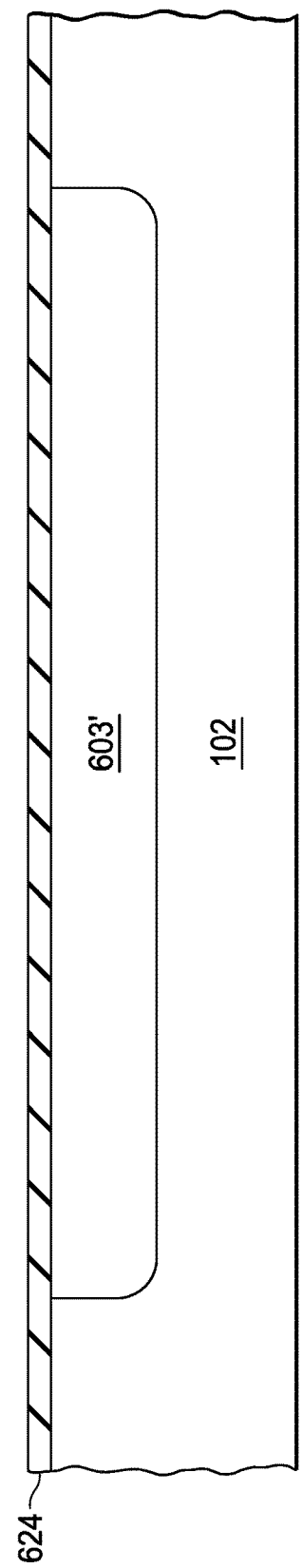

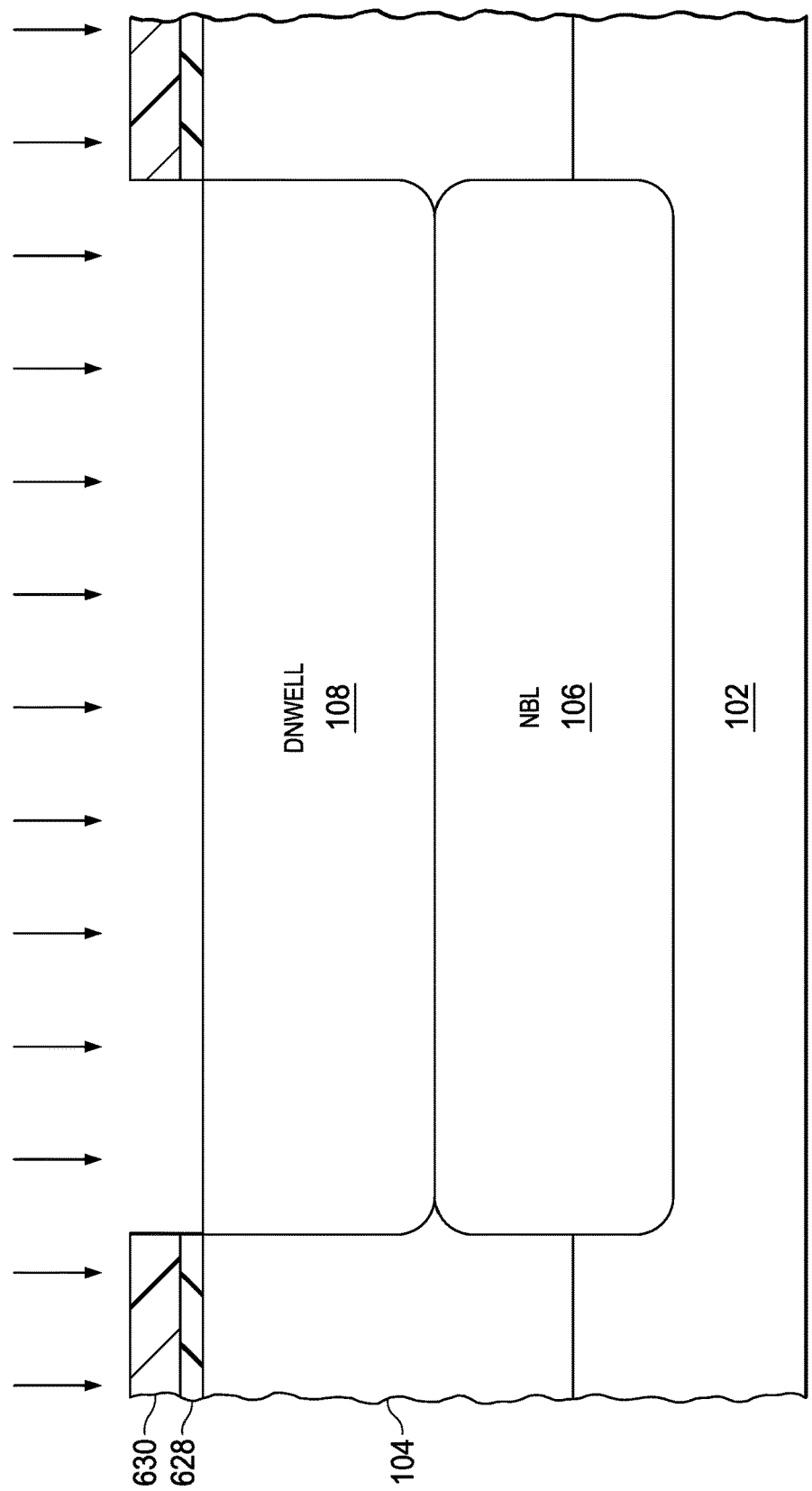

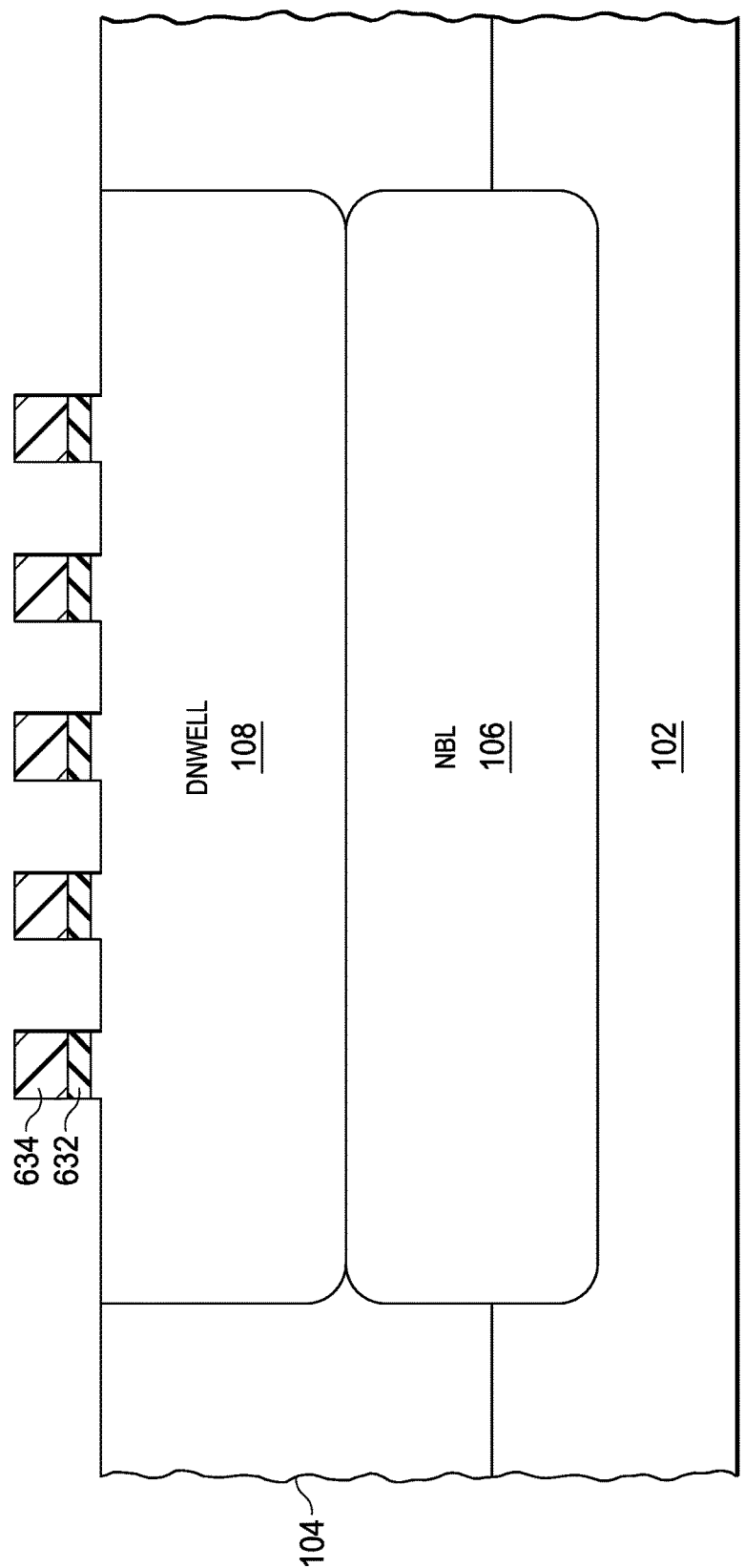

WELL-BASED VERTICAL HALL ELEMENT WITH ENHANCED MAGNETIC SENSITIVITY

FIELD OF THE DISCLOSURE

Disclosed embodiments relate generally to the field of magnetic sensors. More particularly, and not by way of any limitation, the present disclosure is directed to a well-based vertical Hall element with enhanced magnetic sensitivity.

BACKGROUND

Vertical Hall elements, which detect a magnetic field lying in the plane of the integrated circuit in which the vertical Hall element is formed, can be formed in either a substrate region that has uniform, low dopant concentration or in implanted wells. When the vertical Hall elements are formed in implanted wells, historically these Hall elements inherently have low sensitivity to in-plane magnetic fields. Increases in sensitivity are conventionally achieved by narrowing the well and/or well contact region. However, such narrowing leads to undesirably higher electrical resistance. Greater sensitivity without increased resistance is desired.

SUMMARY

Disclosed embodiments add a buried layer beneath the well-based vertical Hall element. The buried layer has the same conductivity type as the well but a higher concentration. Properly engineered, this buried layer draws biasing current deeper into the region of the well where there is lower dopant concentration than near the surface. This region of lower concentration provides higher Hall effect sensitivity.

In one aspect, an embodiment of a method of fabricating a vertical Hall element is disclosed. The method includes forming a buried region having a first dopant of a first conductivity type in a substrate having a second conductivity type opposite the first conductivity type, the buried region having a first doping concentration increasing with an increasing depth extended from a top surface of the substrate; implanting a second dopant of the first conductivity type into a well region between the top surface of the substrate and the buried region, the well region having a second doping concentration decreasing from the top surface of the substrate to the buried region; forming first, second and third contacts on the well region, the first and second contacts defining a first conductive path through the well region, the second and third contacts defining a second conductive path through the well region; forming a fourth contact on the well region between the first and second contacts; and forming a fifth contact on the well region between the second and third contacts.

In another aspect, an embodiment of an integrated circuit is disclosed. The integrated circuit includes a substrate having a top surface and a first conductivity type; a well region formed in the substrate, the well region being doped with a first dopant of a second conductivity type that is opposite the first conductivity type and having a first doping concentration that decreases with an increasing distance from the top surface of the substrate; a buried region formed under and in contact with the well region, the buried region being doped with a second dopant of the second conductivity type and having a second doping concentration that increases with increasing distance from the well region; first, second and third contacts formed on the well region, the first and second contacts defining a first conductive path through the well region, the second and third contacts defining a second conductive path through the well region; a fourth contact formed on the well region between the first and second contacts; and a fifth contact formed on the well region between the second and third contacts.

In a further aspect, a vertical Hall element is disclosed. The vertical Hall element includes a substrate having a top surface and a first conductivity type; a well region formed in the substrate, the well region being doped with a first dopant of a second conductivity type that is opposite the first conductivity type and having a first doping concentration that decreases with an increasing distance from the top surface of the substrate; a buried region formed under and in contact with the well region, the buried region being doped with a second dopant of the second conductivity type and having a second doping concentration that increases with an increasing distance from the well region; first, second and third contacts formed on the well region, the first and second contacts defining a first conductive path through the well region, the second and third contacts defining a second conductive path through the well region; a fourth contact formed on the well region between the first and second contacts; and a fifth contact formed on the well region between the second and third contacts.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

FIG. 5 depicts sensitivity to a magnetic field versus resistance for a series of prior art vertical Hall elements and for an embodiment of the disclosure;

FIGS. 6A-6I illustrate fabrication of the vertical Hall element of FIG. 1A according to an embodiment of the disclosure;

FIG. 7 depicts a block diagram of an integrated circuit containing a Hall element and associated circuitry.

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 1A:
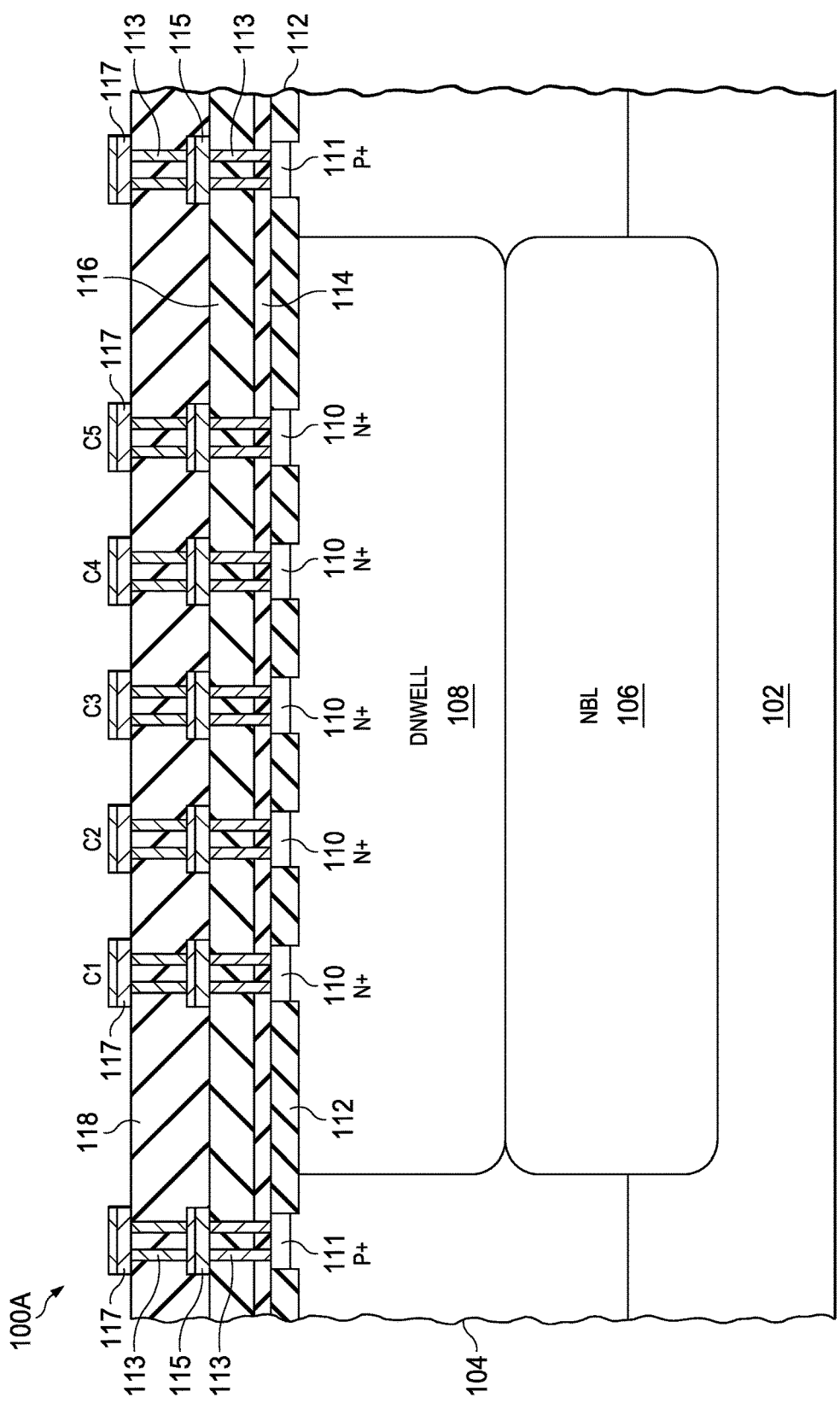
FIG. 1A depicts a cross-section of a vertical Hall element according to an embodiment of the disclosure.

Turning first to FIG. 1A, a cross-section of a vertical Hall element 100A according to an embodiment of the present disclosure is shown. In this embodiment, the vertical Hall element 100A is formed in a p-type substrate 102. In the embodiment shown in this figure, a p-type epitaxial layer 104 has been grown on substrate 102. N-type buried layer (NBL) 106 is formed at the junction of substrate 102 and epitaxial layer 104 and extends into portions of the substrate 102 and the epitaxial layer 104. Deep n-type well (DNWELL) 108 is formed over NBL 106 such that DNWELL 108 extends from the surface of epitaxial layer 104 to NBL 106. As will be discussed in greater detail below, NBL 106 is more heavily doped than DNWELL 108 and acts to increase the sensitivity of the vertical Hall element 100A. Isolation structure 112, which in one embodiment can be implemented by shallow trench isolation (STI) structures, separates both the n-type contact regions 110 from the p-type contact regions 111 from each other and can be topped with a nitride layer 114, a first inter-level dielectric layer (ILD1) 116 and a second inter-level dielectric layer (ILD2) 118. Vias 113, which couple contact regions 110, 111 to a first metal layer 115 and to a second metal layer 117 complete the vertical Hall element 100A. In operation, specific contact regions 110 will be coupled to additional circuitry in order to sense a magnetic field in the plane of the substrate. The five n-type contacts are labeled C1-C5 in order to discuss their operation below. Although the implementation shown in FIG. 1A can be STI structures between the n-type contact regions C1-C5, other implementations may have other configurations between the n-type contact regions C1-C5 (e.g., heavily doped p-type regions or thin oxide layers).

Figure 1B:
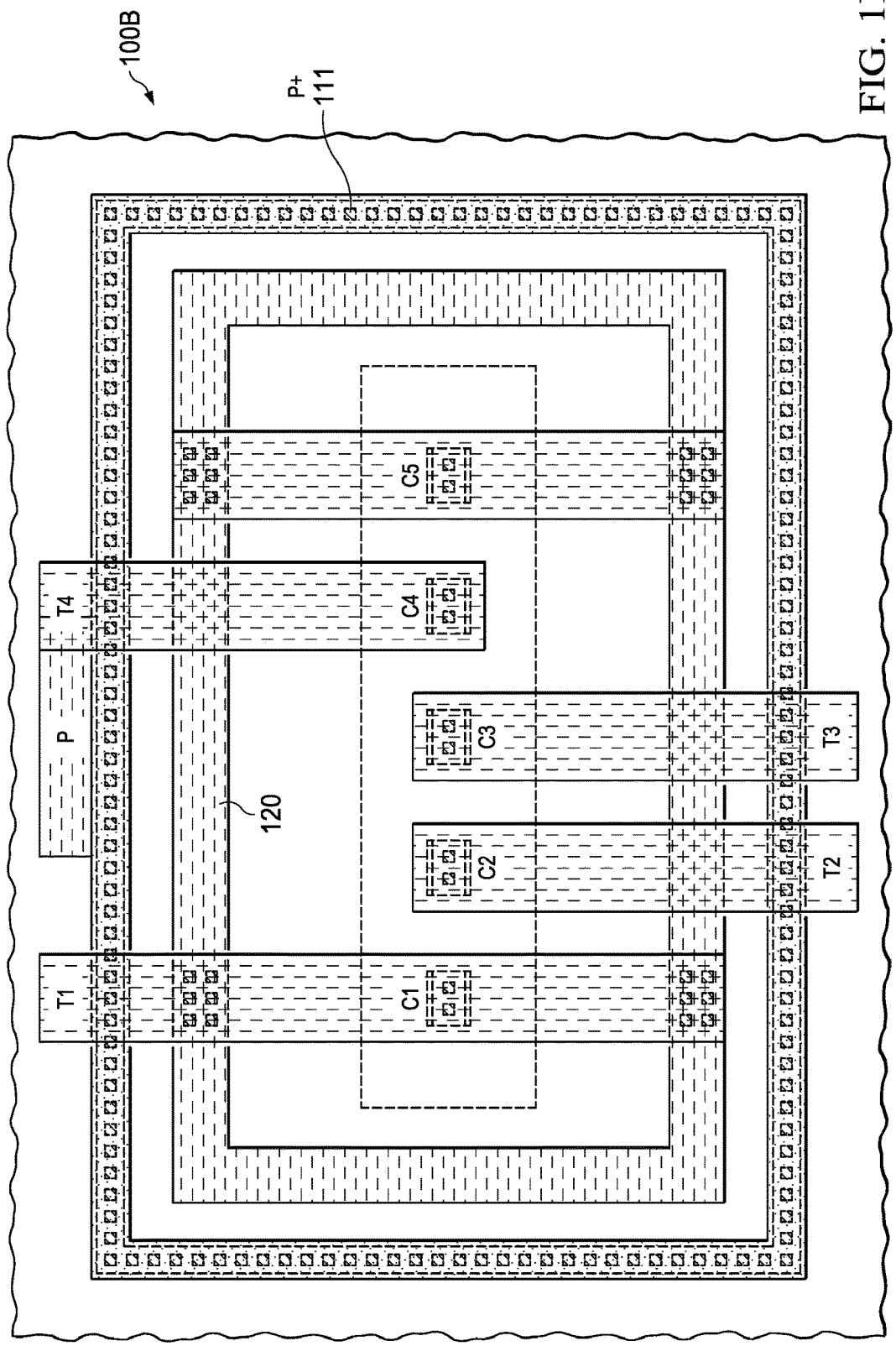
FIG. 1B depicts a layout of the vertical Hall element of FIG. 1A as viewed from above according to an embodiment of the disclosure.

FIG. 1B depicts a layout of a vertical Hall element 100B as seen from above according to an embodiment of the present disclosure. In this embodiment, an outer ring of p-type contacts 111 is formed around the outer perimeter of vertical Hall element 100B and is coupled to the lower rail (e.g., ground) to serve as further isolation for the vertical Hall element 100B. A ring of metallization 120 is formed above the inner periphery of vertical Hall element 100B. Contacts C1 and C5 are each coupled to the metal ring 120 and from there to terminal T1. Contact C3 is coupled via terminal T3 to a power supply (not specifically shown) that can provide a current through vertical Hall element 100B. Contacts C2 and C4 are coupled via terminals T2 and T4 to a voltage detector (not specifically shown), which can sense the voltage between C2 and C4. While the examples shown in the present application are of an n-type well 108 and buried layer 106 in a p-type substrate 102, the use of a buried layer 106 below the well 108 of a vertical Hall element 100A can also be implemented using a p-type well and buried layer in an n-type substrate. Additionally, although FIGS. 1A and 1B illustrate a vertical Hall element that is part of an integrated circuit (IC) and thus requires isolation from the other components of the IC, Hall element 100A, 100B can also be implemented as a discrete component. In an embodiment as a discrete component, details of the substrate, well and buried layer remain the same, but contacts C1-C5 are coupled to external pins for eventual connection to other components.

Operation of a vertical Hall element 200 according to an embodiment of the present disclosure will now be discussed with reference to FIG. 2. During the operation of vertical Hall element 200, a biasing circuit 210 is electrically coupled to contacts C1, C3 and C5 to provide a bias current ($I_{BIAS}$) that passes through the vertical Hall element 200 as depicted by the arrows, i.e., an input from biasing circuit 210 is coupled to contact C3, which passes the current $I_{BIAS}$ into DNWELL 208, where the current splits and flows to contact C1 and contact C5, i.e., half of $I_{BIAS}$ flows toward contact C5 along a path 202B and half of $I_{BIAS}$ flows toward contact C1 along a path 202A. In other words, contacts C1 and C3 define a conductive path 202A through DNWELL 208 and contacts C5 and C3 define another conductive path 202B through DNWELL 208. The presence of NBL 206 draws $I_{BIAS}$ deeper into DNWELL 208 than would occur if NBL 206 were not present. It is noted that the conductive paths illustrated in the figures are not intended to convey an exact location of the conductive path, but are provided for illustration only. When a magnetic field is provided in a direction that emerges perpendicular to the plane of the drawing, as represented by reference numeral B, the magnetic flux lines from the magnetic field exert a force on the electrons flowing along current path 202A. The force deflects these electrons towards the surface of DNWELL 208 and causes a negative charge to accumulate near contact C2. Similarly, the magnetic flux lines exert a force in the opposite direction on the electrons flowing along current path 202B. Here the force deflects the electrons away from the surface of DNWELL 208, causing a positive charge to accumulate around contact C4. As the electrons traveling along current paths 202A, 202B are deflected in different directions, a potential difference is produced between contacts C2 and C4, with the magnitude of the potential difference reflecting the magnitude of the magnetic field. The potential difference between contacts C2 and C4 is monitored using a voltage detector 212 that is electrically coupled to C2 and C4; the presence of a voltage difference between contact C2 and contact C4 is used to detect the presence of a magnetic field.

Figure 2:
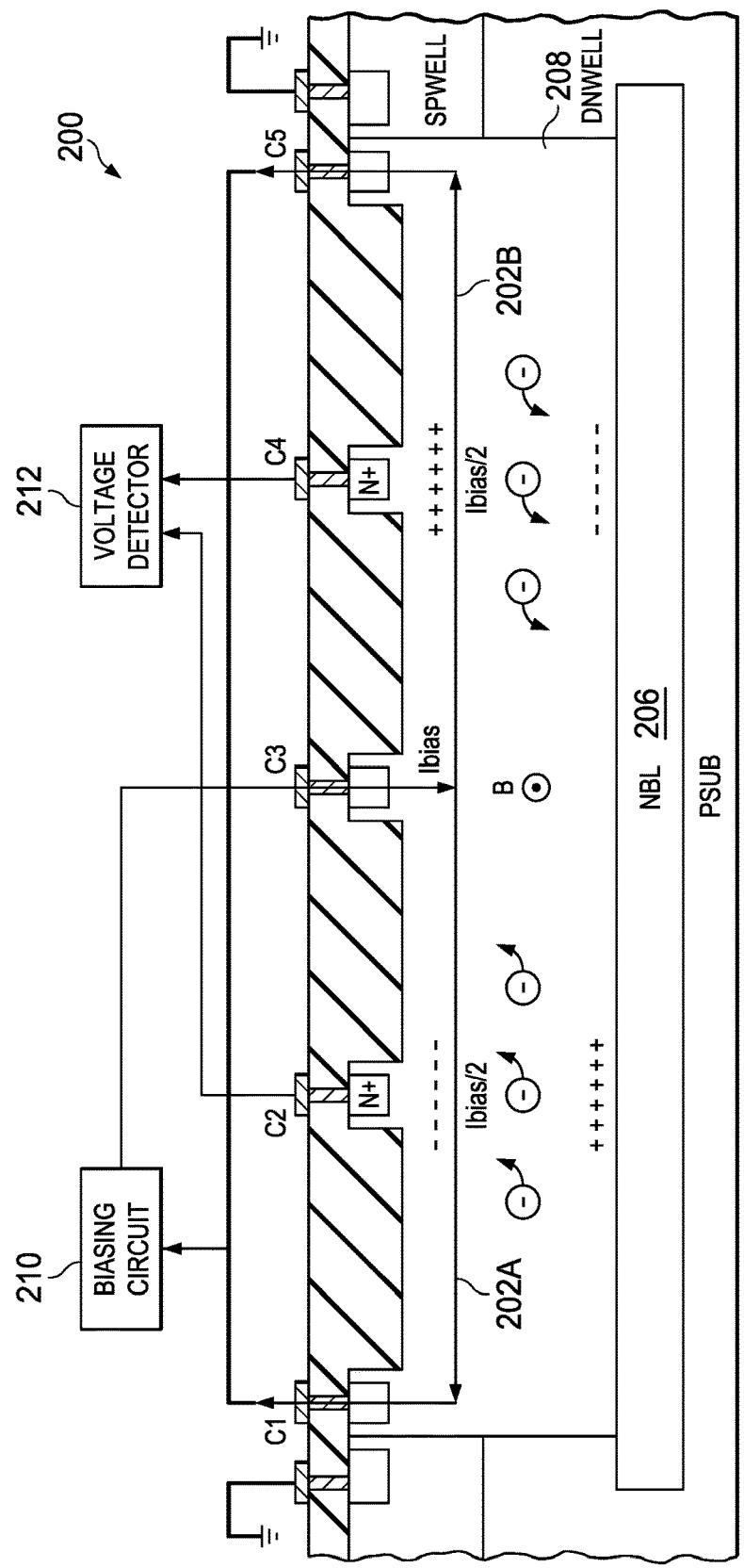
FIG. 2 depicts the operation of the circuit of FIGS. 1A-B in detecting a magnetic field in the plane of the integrated circuit.

Hall element 200 can also be operated with current $I_{BIAS}$ flowing in the opposite direction from the direction shown in FIG. 2 to detect a magnetic field whose direction is reversed from the illustration, i.e., pointing into the image plane. In yet another variation, Hall element 200 can be operated with current $I_{BIAS}$ flowing between contact C2 and contact C4 with the difference in voltage between either contact C1 and contact C3 or else between contact C3 and contact C5 being used to detect the presence of a magnetic field into or out of the plane of the image. The number and arrangement of contacts shown in this figure is meant to be illustrative, rather than restrictive, as many different number and arrangements of contacts can be employed.

Figure 1C:
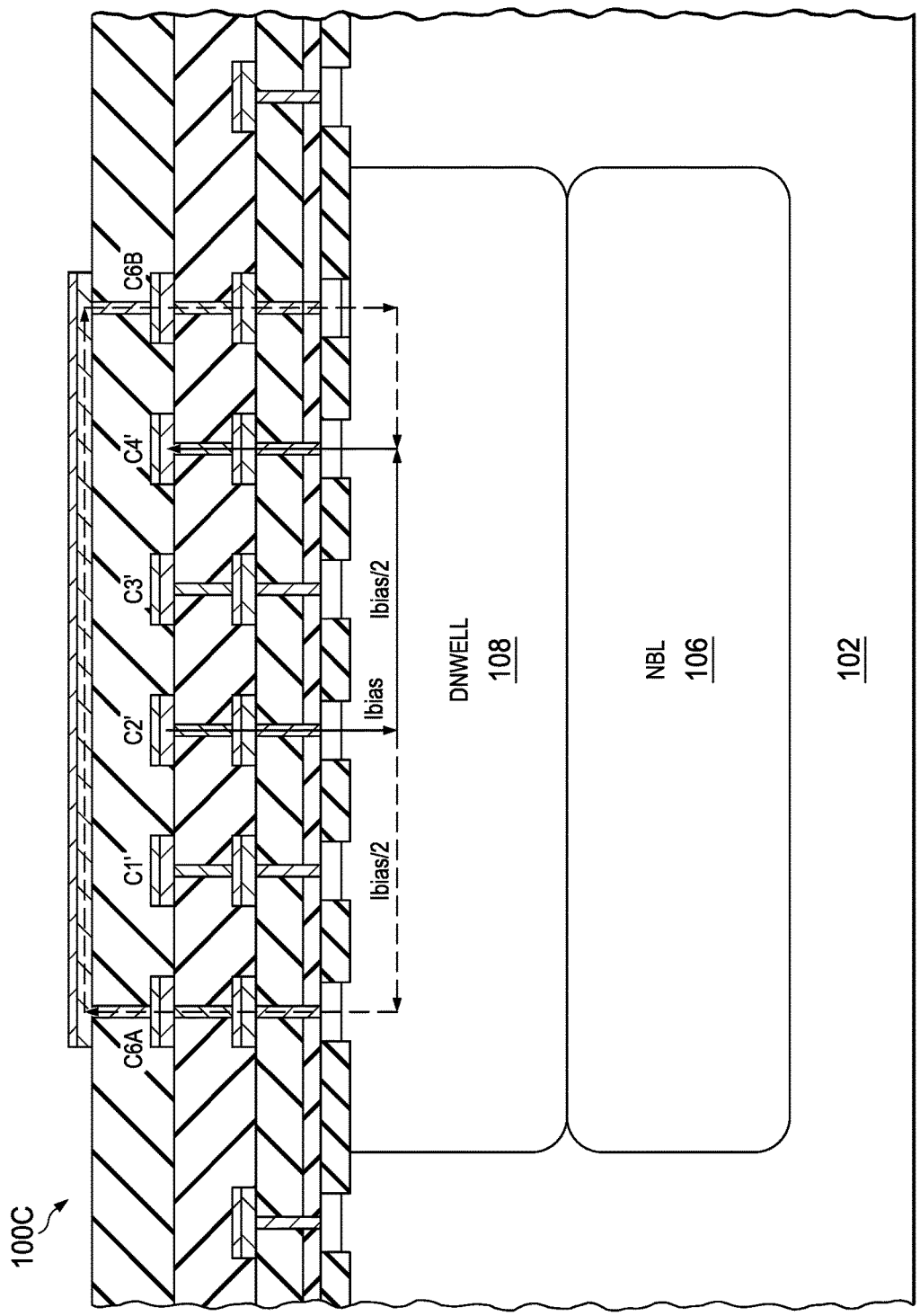
FIG. 1C depicts a cross-section of a vertical Hall element according to an embodiment of the disclosure.

FIG. 1C illustrates an alternate embodiment of a vertical Hall element 100C that uses the disclosed buried layer. Vertical Hall element 100C has been formed in substrate 102 and is similar to Hall element 100A, except that vertical Hall element 100C has six contacts, numbered C1'-C4', C6A and C6B, rather than the five contacts shown in FIG. 1A. In this embodiment, the upper rail is coupled to contact C2', while the contact C6A and contact C6B are coupled together. Bias current ($I_{BIAS}$) is passed from contact C2' to contact C4' along two paths, one shown as a solid line through well region 108 and the other shown as a dotted line that passes from C2' to C6A, through the metallization layer to C6B and from C6B to C4'. As in the earlier embodiment, the presence of NBL 106 draws $I_{BIAS}$ deeper into DNWELL 108 than would occur if NBL 106 were not present. When a magnetic field is provided in a direction that emerges perpendicular to the plane of the drawing (not specifically shown), a voltage difference develops between contact C1' and contact C3'. Changes to the voltage between contact C1' and contact C3' signal the presence of a magnetic field. As in the embodiment shown in FIG. 1A, reversing the flow of the biasing current can be used to detect a magnetic field directed into the plane of FIG. 1C. The Hall element can also be operated with current between contact C1' and contact C3', with the Hall voltage measured between contact C2' and contact C4'. The use of a buried layer beneath a well structure that is part of a Hall element is not limited to the specific embodiments disclosed here.

Figure 3A:
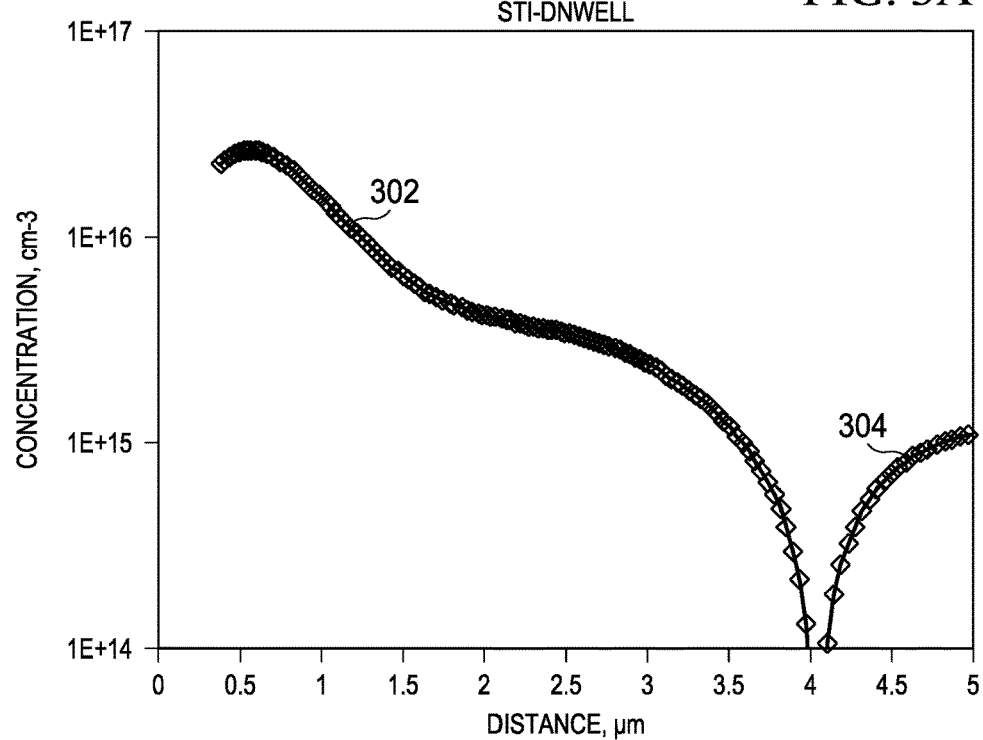
FIG. 3A depicts a graph of the concentration of dopants versus depth for a prior art version of the vertical Hall element without a buried layer.
Figure 3B:
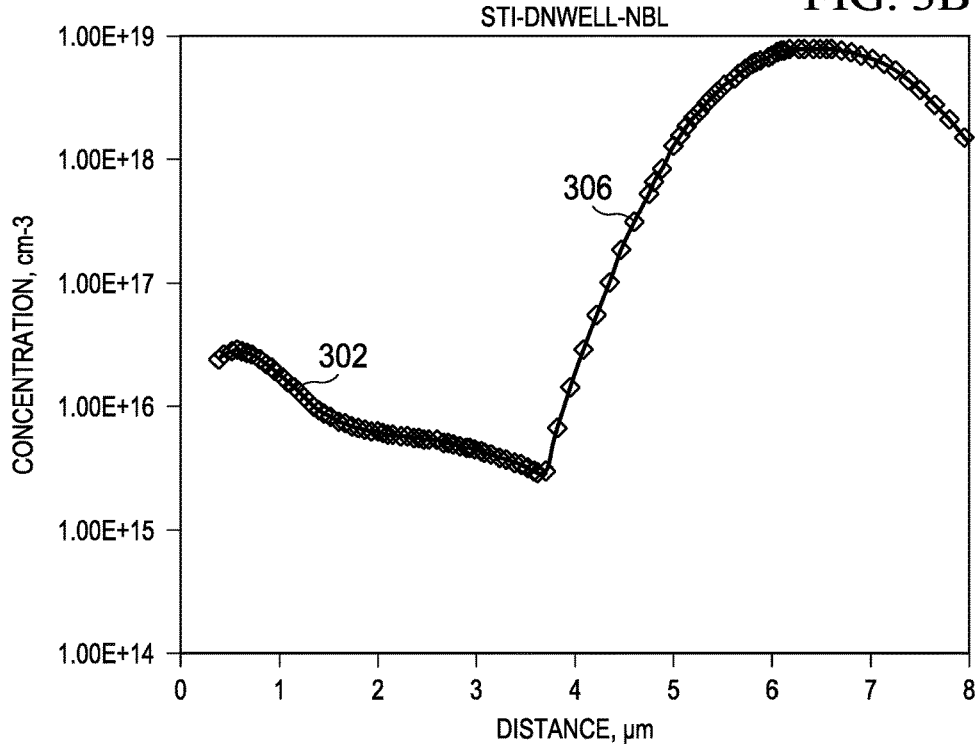
FIG. 3B depicts a graph of the concentration of dopants versus depth for a version of the vertical Hall element having the disclosed buried layer.

FIGS. 3A and 3B compare the dopant profiles for a vertical Hall element according to the prior art and the dopant profiles for the disclosed vertical Hall element according to an embodiment of the present disclosure. In both of FIGS. 3A and 3B, the X-axis shows distance from the surface of the substrate in microns and the Y-axis shows concentration of the dopants per cubic centimeter. In FIG. 3A, curve 302 represents the n-type doping for a deep n-well that does not have the disclosed underlying n-type buried layer. As seen in FIG. 3A, the concentration of dopants in the portion of deep n-well nearest the surface is approximately $3 \times 10^{16}/cm^3$. At greater distances from the surface, the concentration of dopants in the deep n-well drops to approximately $1 \times 10^{14}/cm^3$ at the bottom of the well. Curve 304 represents the p-type epitaxial layer doping, which appears lower near the deep n-well and then rises to approximately $1 \times 10^{15}/cm^3$ at a depth of 5 microns. The presence of the p-n junction below the n-well appears to prevent the biasing current from moving deeper into the well where sensitivity is greater.

In FIG. 3B, the doping profile 302 of the deep n-well 108 is the same as in the example shown in FIG. 3A. However, at the point deep n-well 108 ceases to contribute to the doping profile, n-type buried layer 106 begins contributing, as shown by curve 306. As one moves deeper from the surface of the silicon, the doping of NBL 106 increases from approximately $5 \times 10^{15}/cm^3$ to approximately $9 \times 10^{18}/cm^3$ at approximately 6.5 microns depth. Thus, while the doping concentration of the n-well generally decreases from the top surface of the substrate to the buried layer, the doping concentration of the buried layer increases with an increasing depth from the top surface of the substrate and from the well region. Therefore, rather than a p-n junction at the bottom of n-well 108, which can repel electrons moving in the n-well, there is an increasing concentration of dopant that can attract the electrons and allow the current through the n-well 108 to flow deeper into the well where the sensitivity is increased. The doping of the NBL 106 should be carefully calibrated to ensure that electrons in deep n-well 108 are attracted, but not captured by the buried layer 106. It is important that the doping of NBL 106 is low near the deep n-well 108, otherwise sensitivity would be compromised. Additionally, a large differential between the maximum concentration in the n-well and the maximum concentration in the buried layer is desirable. In FIG. 3B, the differential is approximately 1:100. The differential can also be in the range between 1:10 and 1:1000 inclusive.

Figure 4A:
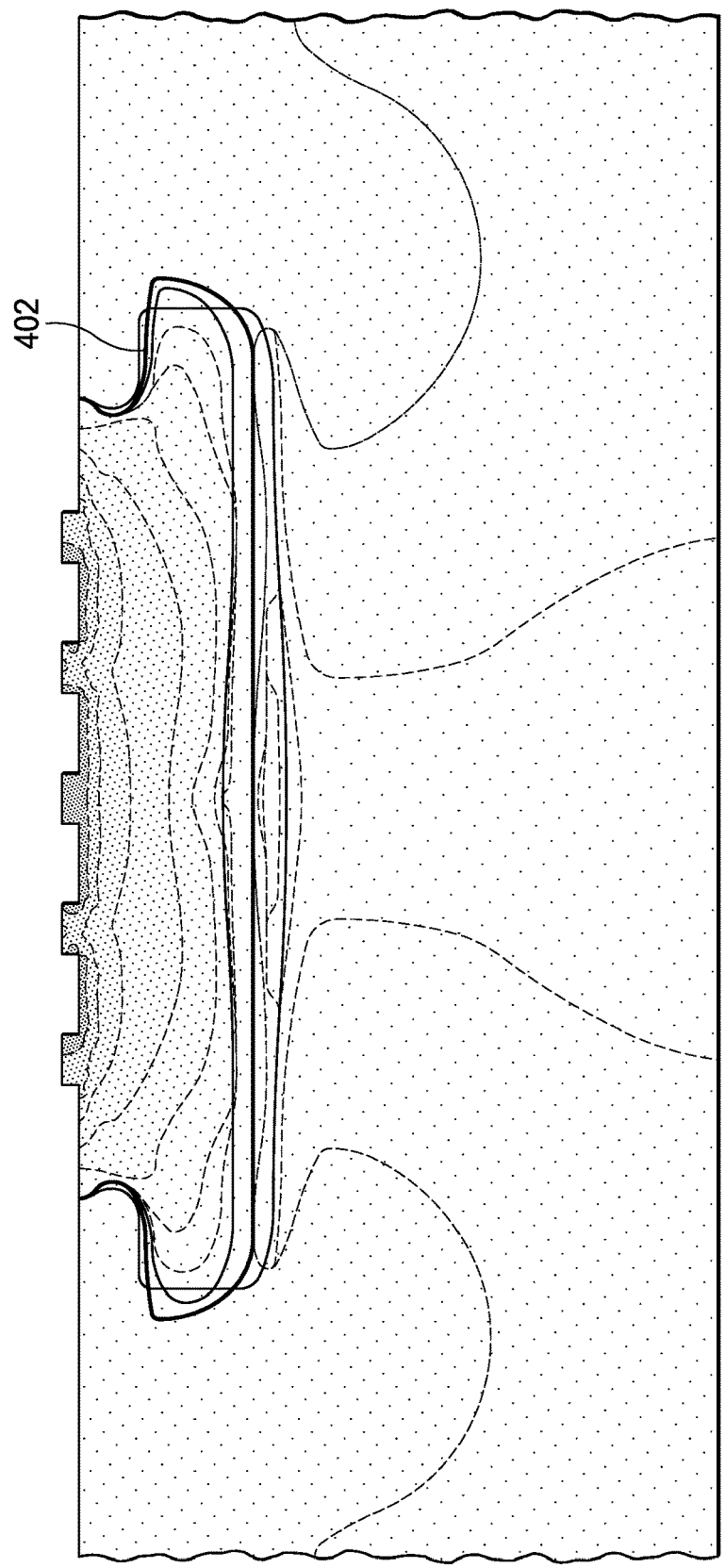
FIGS. 4A and 4B depict current density for a prior art version of the vertical Hall element without a buried layer.
Figure 4B:
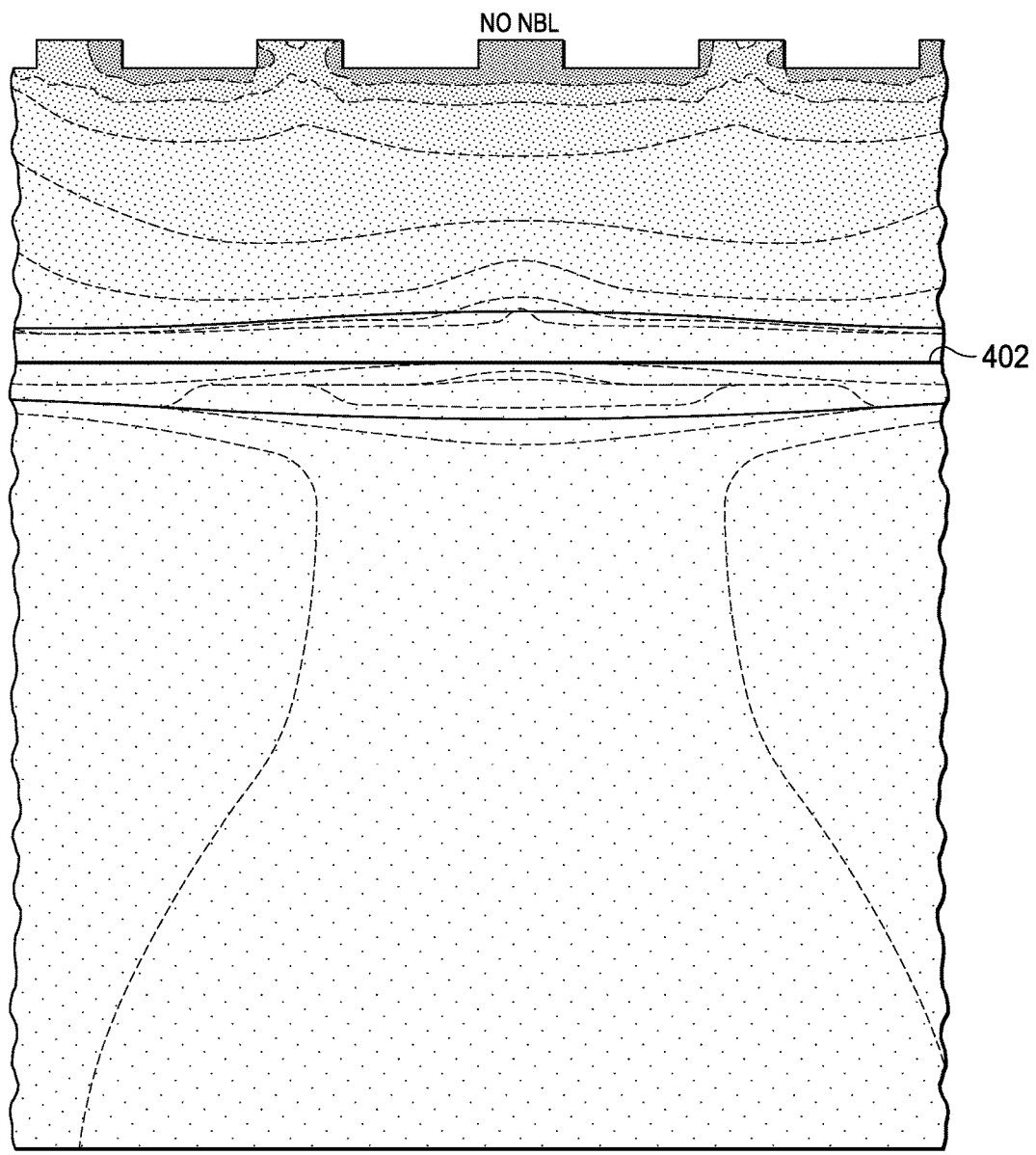
Figure 4C:
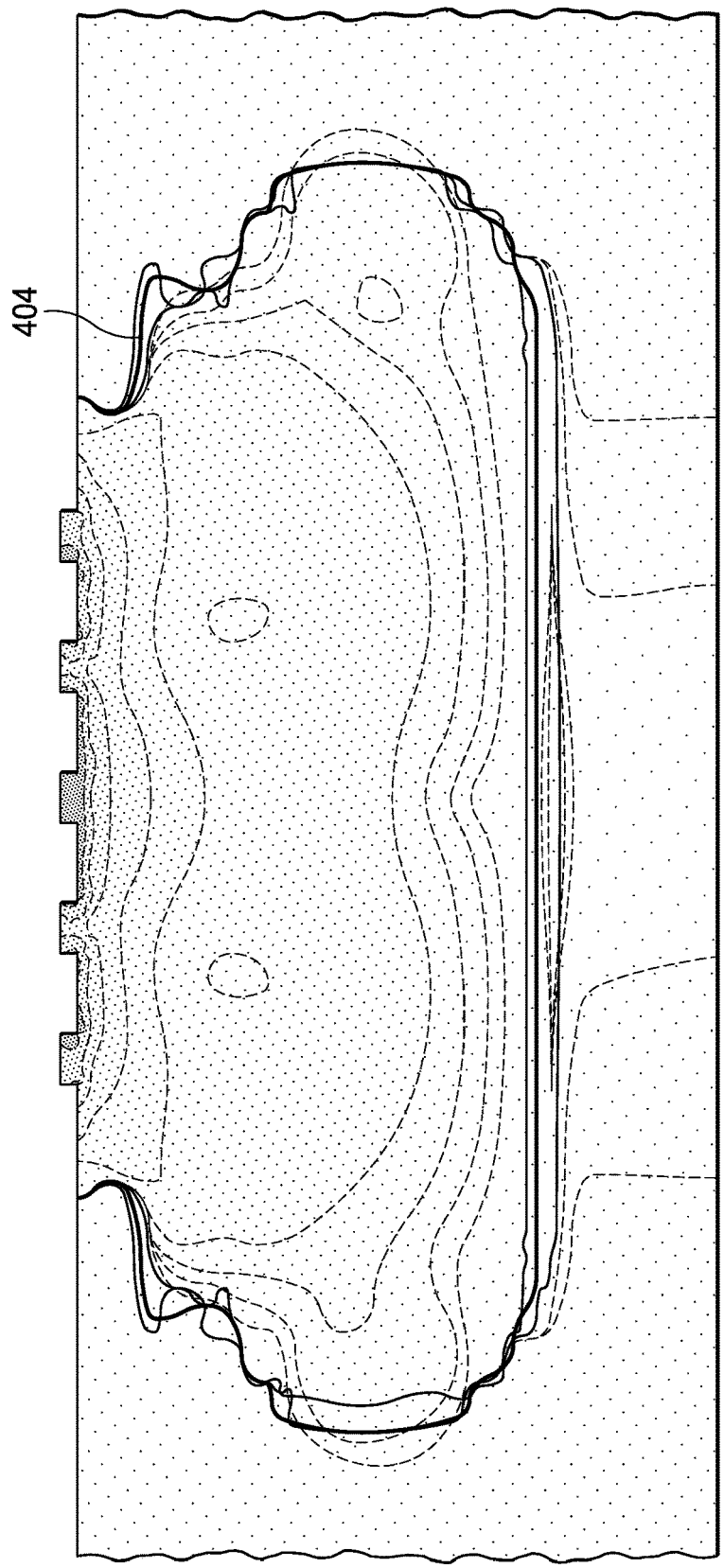
FIGS. 4C and 4D depict current density for a version of the vertical Hall element having a buried layer.
Figure 4D:
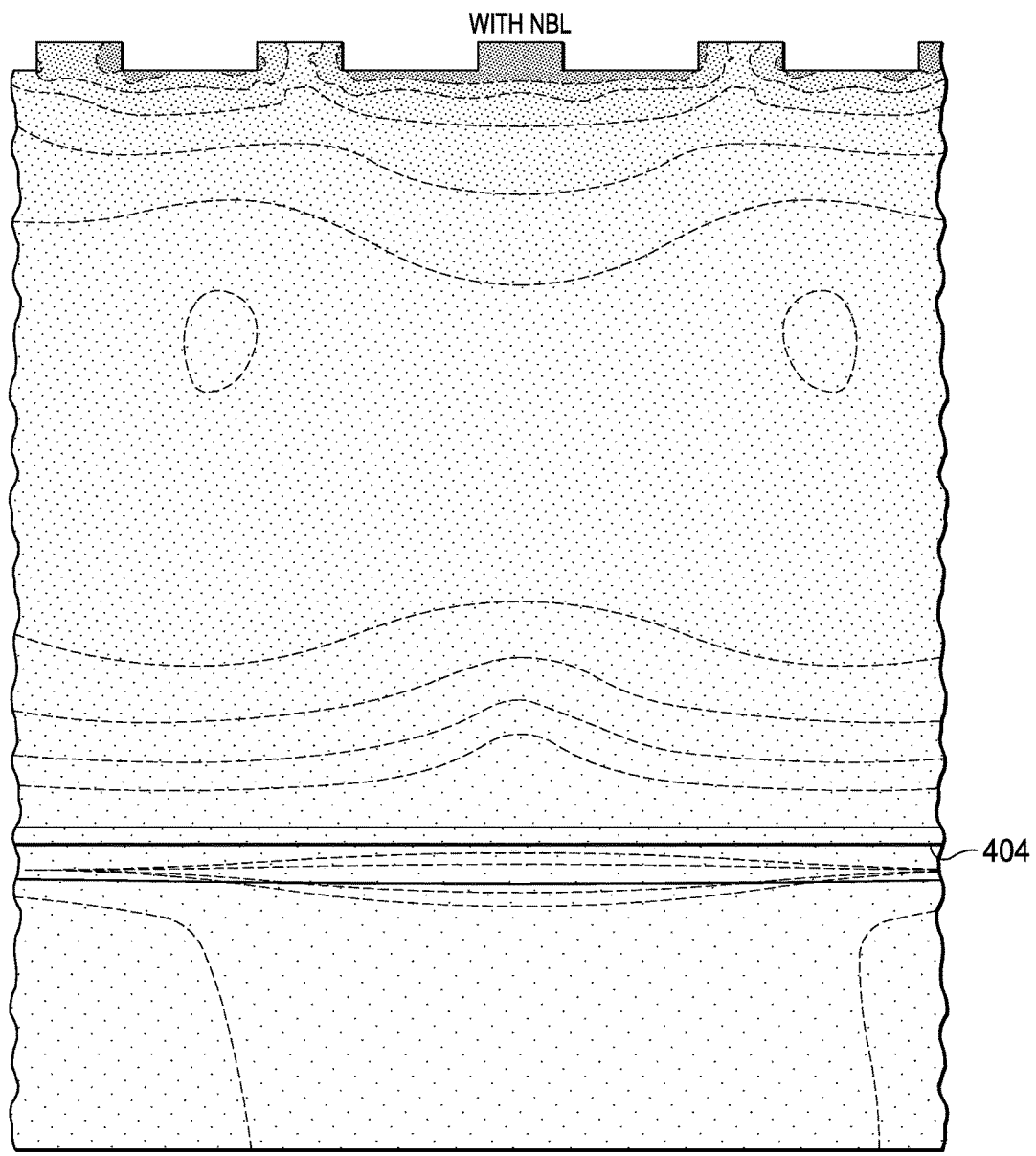

The measured effect of adding a highly-doped buried layer 106 beneath the deep n-well 108 is shown in FIGS. 4A-4D. FIG. 4A depicts current flow within a vertical Hall element according to the prior art (i.e., with no n-type buried layer), with the region of highest current density 402 outlined; FIG. 4B is an enlarged version of the current flow in FIG. 4A. In at least one embodiment, the outlined region generally includes current density having a maximum value of $1.21 \times 10^5$ A/cm$^2$. Note that the current flow is all concentrated in the upper portion of the silicon. FIGS. 4C-4D depict current flow in a vertical Hall element when a highly-doped buried layer is added; again FIG. 4D is an enlargement of FIG. 4C. The outlined region 404 is again the region of highest current density and includes current density having a maximum density of 1.26 A/cm$^2$. As can be seen in FIGS. 4C and 4D, the presence of the highly doped buried layer draws the current flow much deeper into the silicon, where the vertical Hall device is able to provide greater sensitivity without increasing the resistance, as previous attempts to improve the sensitivity have done. The region of current flow is much larger and more effective. Notably, providing a buried layer underneath a vertical Hall element that is not well-based would not have the same effect. In a vertical Hall element that is constructed directly in a substrate or epitaxial layer and not in a well, the doping throughout the body of the vertical Hall element remains essentially the same; even if the current were pulled deeper into the element, there is no differential in doping concentration in the vertical Hall element itself to provide the increased sensitivity.

FIG. 5 provides a graph 500 that illustrates a comparison of a presently disclosed embodiment with previous attempts to increase sensitivity. The sensitivity of various vertical Hall elements, which is measured in volts per ampere per Tesla, is plotted against resistance in ohms. In previous attempts to increase sensitivity, which are graphed with open circles, increases in sensitivity tend to correlate, in a roughly linear manner, with increases in resistance. However the disclosed embodiment, which is graphed with a closed circle, provides sensitivity that lies roughly in the middle of the embodiments lacking a buried layer while providing a resistance that is lower than all but one of the embodiments that lack a buried layer.

Figure 6A:
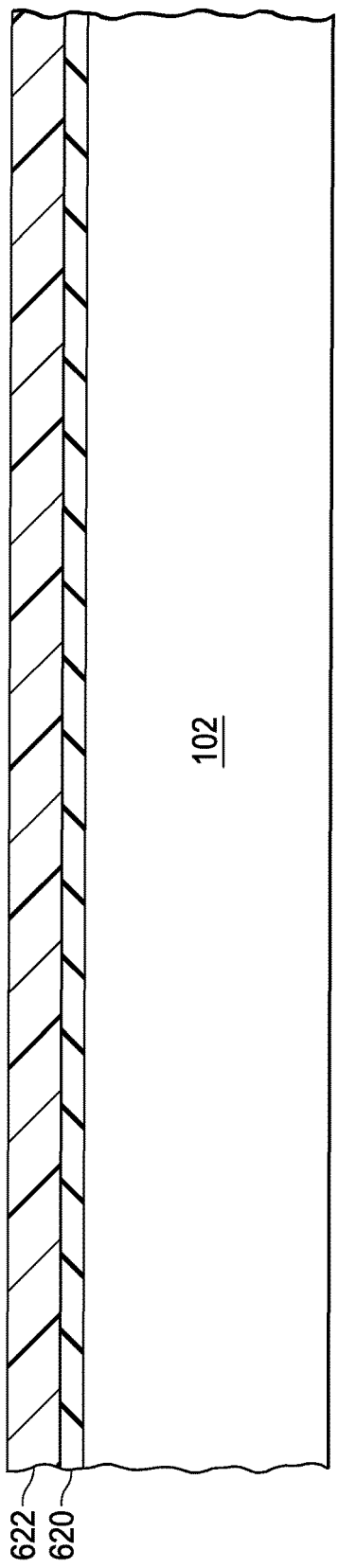
Figure 6B:
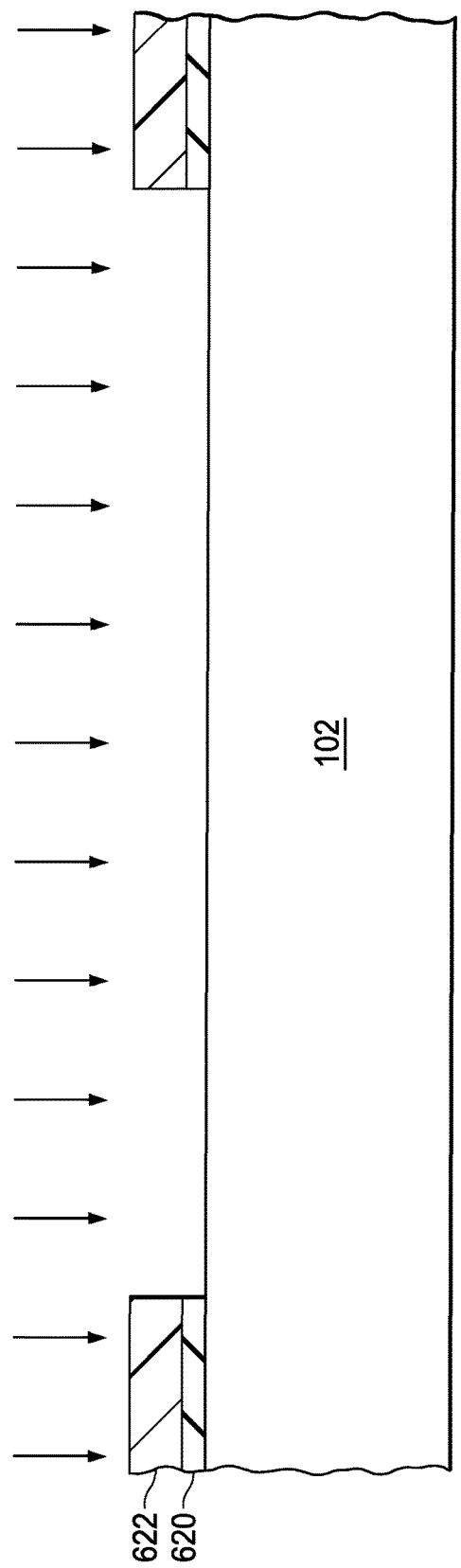

FIGS. 6A-6I illustrate various points during the process of fabricating an integrated circuit having a vertical Hall element according to an embodiment of the present disclosure. In FIG. 6A, p-type substrate 102 provides the starting material. An upper surface of substrate 102 is oxidized to form oxide layer 620 on the surface of substrate 102, followed by deposition of photoresist layer 622. In FIG. 6B, photoresist 622 has been patterned to provide an opening in the region where the n-type buried layer is desired, oxide layer 620 has been removed from this region, and an n-type dopant is being implanted into substrate 102. In one embodiment, the dopant is antimony, which is implanted at a dosage of between approximately $8\times10^{14}/cm^2$ to approximately $5\times10^{15}/cm^2$ and energy of between approximately 60 KeV and 150 KeV. In one embodiment, antimony is deposited at a dosage of $3.0\times10^{15}/cm^2$ at 60 KeV. FIG. 6C illustrates the same region of substrate 102 after the dopant has been implanted to form region 603 and any remaining photo resist has been removed.

After the implantation is completed, oxide layer 620 is removed and a new oxide layer 624 is grown. As seen in FIG. 6D, an annealing process has been performed to diffuse the dopant in region 603 to arrive at diffused dopant region 603' and to heal any damage to the substrate 102 caused by the implantation. In one embodiment, the annealing process is performed for 150 minutes at 550° C., for 120 minutes ramping from 550° to 1150° C., for 30 minutes ramping from 1150° to 1200° C., for 80 minutes at 1200° C., for 50 minutes ramping from 1200° to 1150° C., for 60 minutes ramping from 1150° to 1000° C., and for 100 minutes ramping from 1000° to 600° C.

Figure 6E:
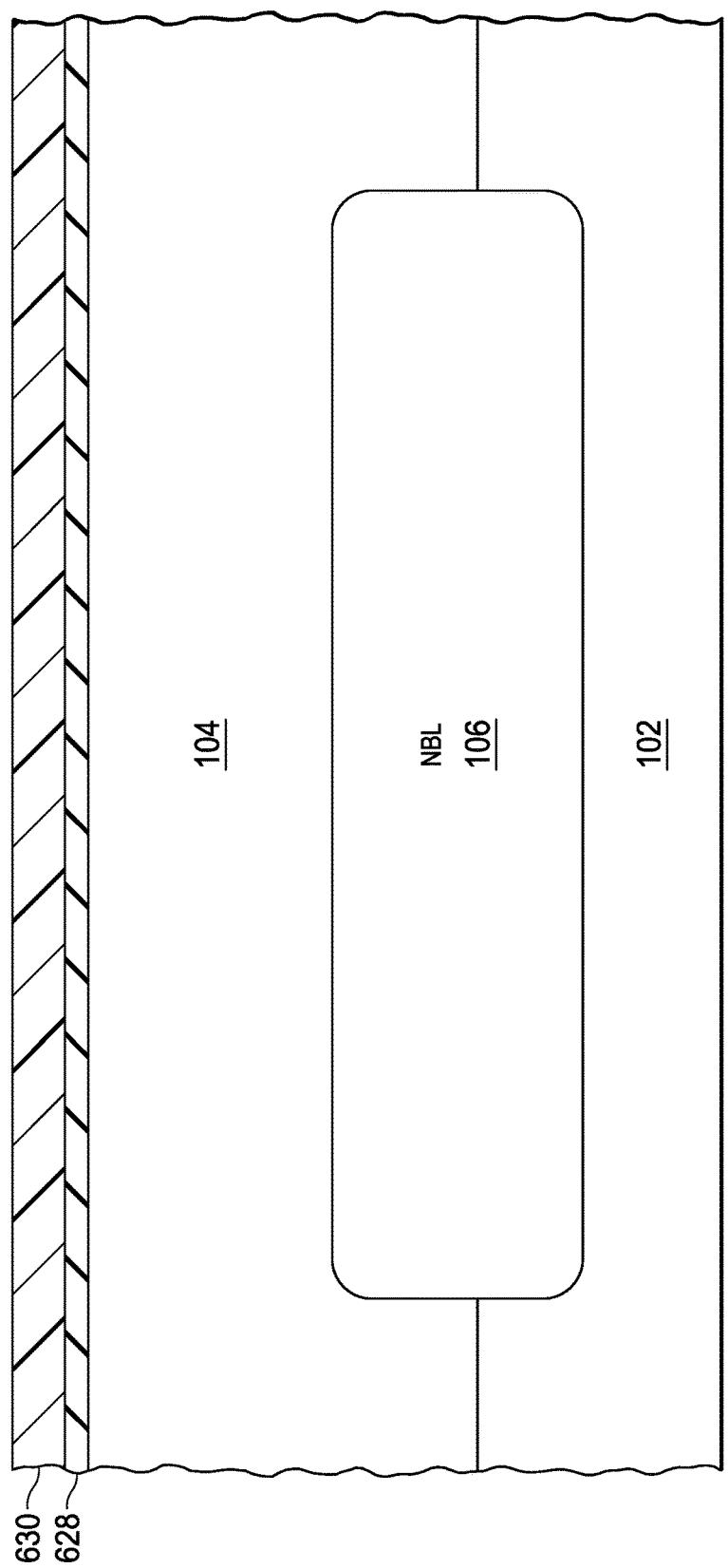

Following the annealing process, oxide layer 624 is removed and epitaxial layer 104 is grown. As epitaxial layer 104 is grown, region 603 is driven into epitaxial layer 104 to form buried layer 106, as illustrated in FIG. 6E. As also seen in FIG. 6E, oxide layer 628 has been grown on the surface of epitaxial layer 104 and photoresist 630 has been deposited in preparation of implanting deep well 108. As seen in FIG. 6F, photoresist 630 and oxide layer 628 have been patterned to expose the region over buried layer 106 and the dopant for deep n-well 108 is being implanted. In one embodiment, deep n-well 108 is implanted with both phosphorus at a dose of $2.0\times10^{11}/cm^2$ at 2 MeV and arsenic at a dose of $3.0\times10^{12}/cm^2$ at 160 KeV. This will be followed by stripping oxide layer 628 and photoresist 630, growing a new oxide layer 632 and annealing the wafer. In one embodiment, the annealing process is performed for 35 minutes while ramping from 750° to 900° C., for 20 minutes ramping from 900° to 1000° C., for 25 minutes ramping from 1000° to 1100° C., for 17 minutes ramping from 1100° to 1150° C., for 277 minutes at 1150° C., for 80 minutes ramping from 1150° to 910° C., and for 80 minutes ramping from 910° to 750° C.

Figure 6H:
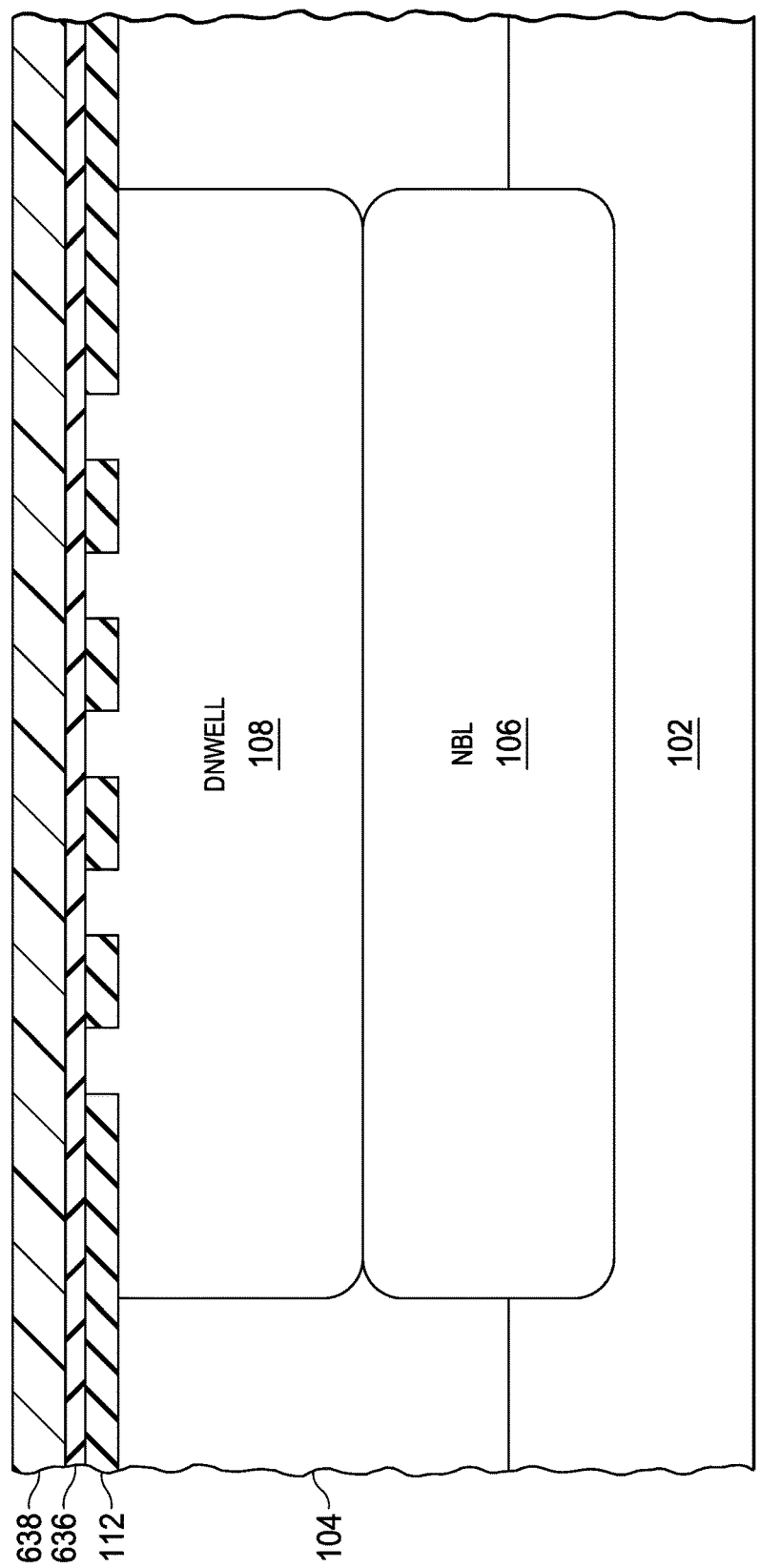
Figure 6I:
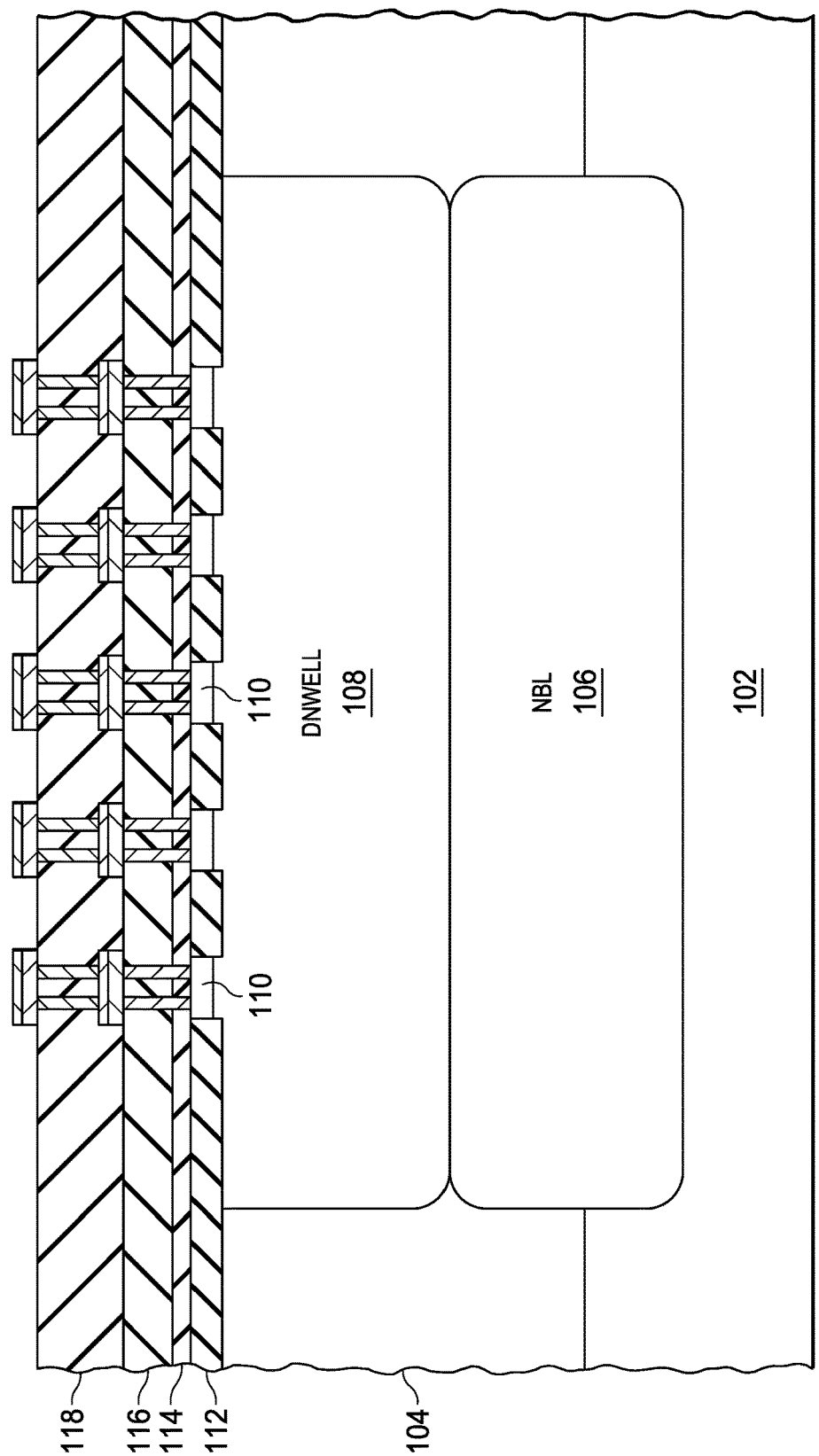

Following the annealing process, photoresist 634 is deposited and patterned to expose regions over deep n-well 108 where shallow trench isolation is desired. Regions for the shallow trench isolation are etched, giving the structure illustrated in FIG. 6G. FIG. 6H illustrates the process after the shallow trenches have been filled, forming isolation structures 112, which in this embodiment are STI structures. New oxide layer 636 has been formed and photoresist 638 has been deposited in preparation for implanting n+ or p+ dopants into the contact regions 110 within deep n-well 108 and the surrounding ring of p-type contacts 111. It will be understood that the n+ and p+ implants are performed in two separate operations. A first photoresist layer (not specifically shown) is deposited and patterned and n-type dopants are implanted; after the implantation of n-type dopants is completed, a second photoresist layer (also not specifically shown) is deposited and patterned and p-type dopants are implanted. In one embodiment, the n-type contacts 110 within deep n-well 108 are doped with both arsenic at a dose of $1.0\times10^{15}/cm^2$ at 50 KeV and with phosphorus at a dose of $1.0\times10^{14}/cm^2$ at 70 KeV. In one embodiment, the p-type contacts 111 are doped with boron at a dose of $2.3\times10^{15}/cm^2$ at 10 KeV. Further processing to provide inter-level dielectrics and metallization, as shown in FIG. 6I are conventional and well known to one skilled in the art and are not detailed herein.

FIG. 7 depicts a block diagram of an integrated circuit chip 700 that includes a Hall element 704 and additional circuitry. In this embodiment, IC 700 includes biasing circuit 702, which provides the biasing current to appropriate contacts of Hall element 704, which in at least one embodiment is a vertical Hall element having a highly-doped buried layer under a deep n-well that forms the vertical Hall element, and voltage detector 706, which monitors the contacts within the Hall element 704 that are provided for voltage detection and interprets the results to provide an indication when a magnetic field is near. One use of chip 700 is in automobiles, where the Hall element 704 and a magnet can be used to indicate whether a door or trunk is open or closed and provide an indicator light to the driver of the vehicle.

Figure 8A:
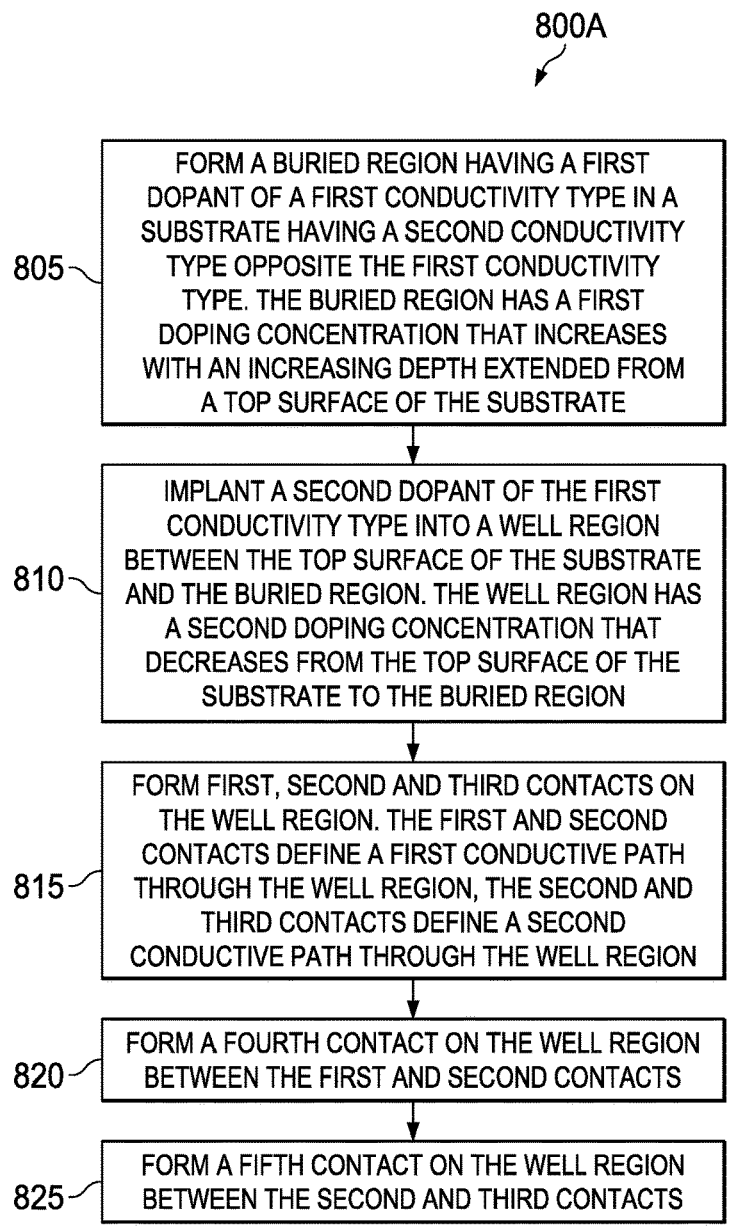
FIG. 8A depicts a generalized method of fabricating a vertical Hall element according to an embodiment of the disclosure.
Figure 8D:
FIGS. 8B-8D depict additional details of a method for fabricating an integrated circuit according to an embodiment of the disclosure.
Figure 8B:
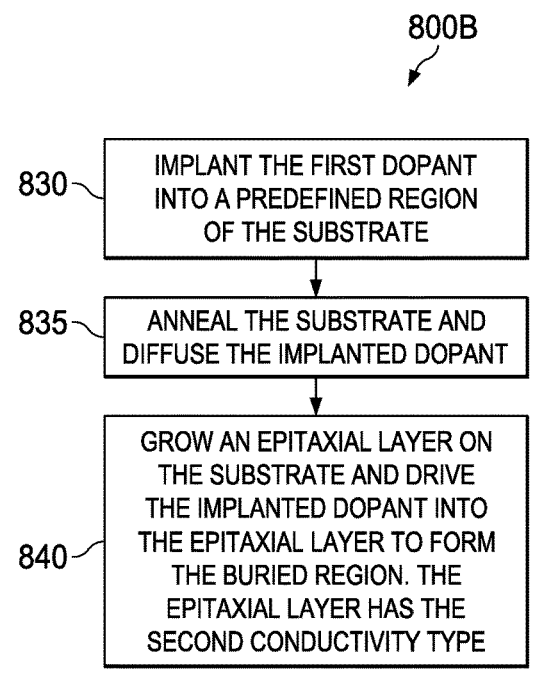
Figure 8C:
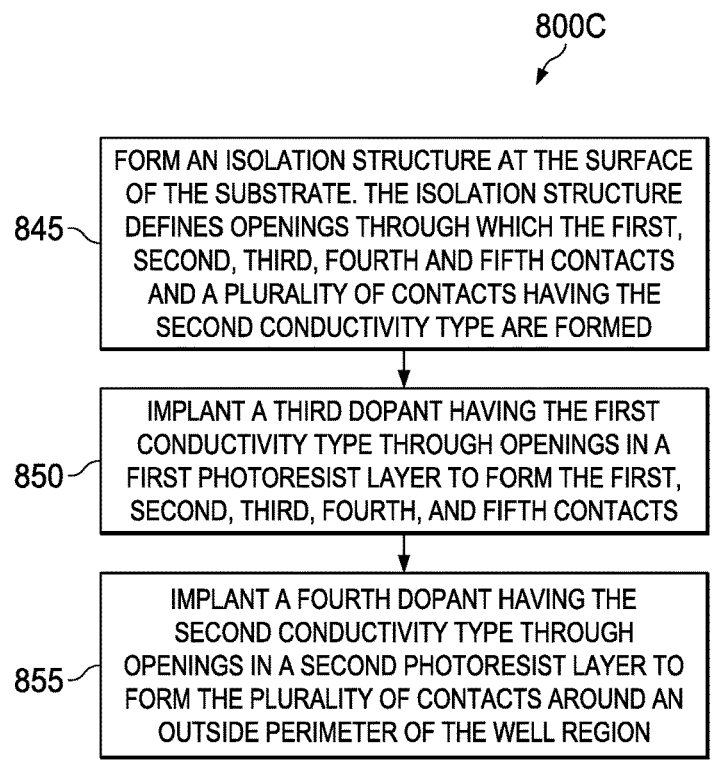

FIG. 8A depicts a generalized method (800A) for fabricating a vertical Hall element, while greater details of a specific embodiment are provided in FIGS. 8B-D. Method 800A begins by forming (805) a buried region that has a first dopant of a first conductivity type in a substrate having a second conductivity type that is opposite the first conductivity type. The buried region has a first doping concentration that increases with an increasing depth extended from a top surface of the substrate. In one embodiment, the buried region has an n-type doping and the substrate has a p-type doping. A second dopant of the first conductivity type is implanted (810) into a well region between the top surface of the substrate and the buried region. The well region has a second doping concentration that decreases from the top surface of the substrate to the buried region. First, second and third contacts are formed (815) on the well region. The first and second contacts define a first conductive path through the well region, the second and third contacts define a second conductive path through the well region. During operation of the Hall element, these conductive paths carry the biasing current. A fourth contact is formed (820) on the well region between the first and second contacts and a fifth contact if formed (825) on the well region between the second and third contacts. During operation the fourth and fifth contacts provide a voltage difference that is used to detect a magnetic field.

FIGS. 8B-8D together depict additional details of method 800 of fabricating a well-based vertical Hall element according to an embodiment of the present disclosure. Method 800B depicts details of forming the buried layer according to one embodiment and begins with implanting (830) the first dopant into a predefined region of the substrate, e.g., to form region 603. The method continues with annealing (835) the substrate and diffusing the implanted dopant. Next, the method grows (840) an epitaxial layer on the substrate and drives the implanted dopant into the epitaxial layer to form the buried region. The epitaxial layer has the same dopant type as the substrate, e.g., the second conductivity type.

Method 800C provides further details regarding forming the contacts associated with the Hall element and continues by forming (845) an isolation structure at the surface of the substrate. The isolation structure defines openings through which the first, second, third, fourth and fifth contacts and a plurality of contacts having the second conductivity type are formed. A third dopant having the first conductivity type is implanted (850) through openings in a first photoresist layer to form the first, second, third, fourth, and fifth contacts. Next, a fourth dopant having the second conductivity type is implanted (855) through openings in a second photoresist layer to form the plurality of contacts around an outside perimeter of the well region. In method 800D, the substrate is annealed (860). Method 800D can be performed at several different points in the process, e.g., subsequent to implanting the first dopant at element 830 and subsequent to implanting the second dopant at element 810.

Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A method of fabricating a vertical Hall element, the method comprising:
    forming a buried region having a first dopant of a first conductivity type in a substrate having a second conductivity type opposite the first conductivity type, the buried region having a first doping concentration increasing with an increasing depth extended from a top surface of the substrate;
    implanting a second dopant of the first conductivity type into a well region between the top surface of the substrate and the buried region, the well region having a second doping concentration decreasing from the top surface of the substrate to the buried region;
    forming first, second and third contacts on a top surface of the well region, the first and second contacts defining a first conductive path through the well region, the second and third contacts defining a second conductive path through the well region;
    forming a fourth contact on the well region between the first and second contacts; and
    forming a fifth contact on the well region between the second and third contacts.

2. A method of fabricating a vertical Hall element, the method comprising:
    implanting a first dopant into a predefined region of the substrate to form a buried region having a first dopant of a first conductivity type in a substrate having a second conductivity type opposite the first conductivity type;
    annealing the substrate and diffusing the implanted dopant, the buried region having a first doping concentration increasing with an increasing depth extended from a top surface of the substrate;
    growing an epitaxial layer on the substrate and driving the implanted dopant into the epitaxial layer to form the buried region, the epitaxial layer having the second conductivity type;
    implanting a second dopant of the first conductivity type into a well region between the top surface of the epitaxial layer and the buried region, the well region having a second doping concentration decreasing from the top surface of the epitaxial layer to the buried region;
    forming first, second and third contacts on a top surface of the well region, the first and second contacts defining a first conductive path through the well region, the second and third contacts defining a second conductive path through the well region;
    forming a fourth contact on the well region between the first and second contacts; and
    forming a fifth contact on the well region between the second and third contacts.

3. The method as recited in claim 1 further comprising forming an isolation structure at the surface of the substrate, the isolation structure defining openings through which the first, second, third, fourth and fifth contacts and a plurality of contacts having the second conductivity type are formed.

4. The method as recited in claim 3 further comprising implanting a third dopant having the first conductivity type through openings in a first photoresist layer to form the first, second, third, fourth, and fifth contacts.

5. The method as recited in claim 4 further comprising implanting a fourth dopant having the second conductivity type through openings in a second photoresist layer to form the plurality of contacts around an outside perimeter of the well region.

6. The method as recited in claim 5 wherein the forming a buried region comprises implanting antimony at a dosage of between approximately $8 \times 10^{14}$/ cm$^2$ and approximately $5 \times 10^{15}$/cm$^2$ and energy of between approximately 60 KeV and 150 KeV.

7. The method as recited in claim 5 wherein the forming a buried region comprises implanting antimony at a dosage of approximately $3 \times 10^{15}$/cm$^2$ and energy of 60 KeV.

8. The method as recited in claim 5 further comprising, subsequent to implanting the first dopant, annealing the substrate at temperatures that range from approximately 550° C. to 1150° C. for a period totaling approximately 590 minutes.

9. The method as recited in claim 5 wherein implanting the second dopant comprises implanting phosphorus at a dosage of approximately $2 \times 10^{11}$/cm$^2$ and energy of 2 MeV and implanting arsenic at a dosage of approximately $3 \times 10^{12}$/cm$^2$ and energy of 160 KeV.

10. The method as recited in claim 9 further comprising, subsequent to implanting the second dopant, annealing the substrate at temperatures that range from approximately 750° C. to 1150° C. for a period totaling approximately 534 minutes.

11. The method as recited in claim 5 wherein implanting the third dopant comprises implanting arsenic at a dosage of $1 \times 10^{15}$/cm$^2$ and energy of 50 KeV and implanting phosphorus at a dosage of $1 \times 10^{14}$/cm$^2$ and energy of 70 KeV.

12. The method as recited in claim 5 wherein implanting the fourth dopant comprises implanting boron at a dosage of $2.3 \times 10^{15}$/cm$^2$ and energy of 10 KeV.

13. The method as recited in claim 2 further comprising forming an isolation structure at the surface of the epitaxial layer, the isolation structure defining openings through which the first, second, third, fourth and fifth contacts and a plurality of contacts having the second conductivity type are formed.

14. The method as recited in claim 13 further comprising implanting a third dopant having the first conductivity type through openings in a first photoresist layer to form the first, second, third, fourth, and fifth contacts.

15. The method as recited in claim 14 further comprising implanting a fourth dopant having the second conductivity type through openings in a second photoresist layer to form the plurality of contacts around an outside perimeter of the well region.

16. The method as recited in claim 2 wherein the forming a buried region comprises implanting antimony at a dosage of between approximately 8×10$^{14}$/cm$^2$ and approximately 5×10$^{15}$/cm$^2$ and energy of between approximately 60 KeV and 150 KeV.

17. The method as recited in claim 2 wherein the forming a buried region comprises implanting antimony at a dosage of approximately 3×10$^{15}$/cm$^2$ and energy of 60 KeV.

18. The method as recited in claim 2 further comprising, subsequent to implanting the first dopant, annealing the substrate at temperatures that range from approximately 550° C. to 1150° C. for a period totaling approximately 590 minutes.

19. The method as recited in claim 2 wherein implanting the second dopant comprises implanting phosphorus at a dosage of approximately 2×10$^{11}$/cm$^2$ and energy of 2 MeV and implanting arsenic at a dosage of approximately 3×10$^{12}$/cm$^2$ and energy of 160 KeV.

20. The method as recited in claim 2 further comprising, subsequent to implanting the second dopant, annealing the substrate at temperatures that range from approximately 750° C. to 1150° C. for a period totaling approximately 534 minutes.

21. The method as recited in claim 20 further comprising, subsequent to implanting the second dopant, annealing the substrate at temperatures that range from approximately 750° C. to 1150° C. for a period totaling approximately 534 minutes.

22. The method as recited in claim 14 wherein implanting the third dopant comprises implanting arsenic at a dosage of 1×10$^{15}$/cm$^2$ and energy of 50 KeV and implanting phosphorus at a dosage of 1×10$^{14}$/cm$^2$ and energy of 70 KeV.

23. The method as recited in claim 15 wherein implanting the fourth dopant comprises implanting boron at a dosage of 2.3×10$^{15}$/cm$^2$ and energy of 10 KeV.

24. A method of fabricating a vertical Hall element, the method comprising:
    forming a buried region having a first dopant of a first conductivity type in a substrate having a second conductivity type opposite the first conductivity type, the buried region having a first doping concentration increasing with an increasing depth extended from a top surface of the substrate;
    implanting a second dopant of the first conductivity type into a well region in an epitaxial layer on top of the substrate, between a top surface of the epitaxial layer and the buried region, the well region having a second doping concentration decreasing from the top surface of the epitaxial layer to the buried region;
    forming first, second and third contacts on a top surface of the well region, the first and second contacts defining a first conductive path through the well region, the second and third contacts defining a second conductive path through the well region;
    forming a fourth contact on the well region between the first and second contacts; and
    forming a fifth contact on the well region between the second and third contacts.

25. A vertical Hall element, comprising:
    a buried region having a first dopant of a first conductivity type in a substrate having a second conductivity type opposite the first conductivity type, the buried region having a first doping concentration increasing with an increasing depth extended from a top surface of the substrate;
    a well region, having a second dopant of the first conductivity type, between the top surface of the substrate and the buried region, the well region having a second doping concentration decreasing from the top surface of the substrate to the buried region;
    first, second and third contacts on a top surface of the well region, the first and second contacts defining a first conductive path through the well region, the second and third contacts defining a second conductive path through the well region;
    a fourth contact on the well region between the first and second contacts; and
    a fifth contact on the well region between the second and third contacts.

26. A vertical Hall element, comprising:
    a buried region having a first dopant of a first conductivity type in a substrate having a second conductivity type opposite the first conductivity type, the buried region having a first doping concentration increasing with an increasing depth extended from a top surface of the substrate;
    an epitaxial layer on a top surface of the substrate, the epitaxial layer having the second conductivity type;
    a well region between the top surface of the epitaxial layer and the buried region, the well region having a second doping concentration decreasing from the top surface of the epitaxial layer to the buried region;
    first, second and third contacts on a top surface of the well region, the first and second contacts defining a first conductive path through the well region, the second and third contacts defining a second conductive path through the well region;
    a fourth contact on the well region between the first and second contacts; and
    a fifth contact on the well region between the second and third contacts.

* * * * *